(12) United States Patent
Henley (10) Patent No.: US 7,166,520 B1
(45) Date of Patent: Jan. 23, 2007

(54) THIN HANDLE SUBSTRATE METHOD AND STRUCTURE FOR FABRICATING DEVICES USING ONE OR MORE FILMS PROVIDED BY A LAYER TRANSFER PROCESS

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 11/199,870

(22) Filed: Aug. 8, 2005

(51) Int. Cl.
*H01L 21/30* (2006.01)

(52) U.S. Cl. .................... 438/458; 438/455; 438/E21.6

(58) Field of Classification Search ................ 438/455, 438/458
See application file for complete search history.

(56) References Cited

U.S. PATENT DOCUMENTS

| | | | |
|---|---|---|---|
| 6,291,314 B1 | 9/2001 | Henley | |
| 6,291,326 B1 | 9/2001 | Henley | |
| 6,368,930 B1 | 4/2002 | Enquist | |
| 6,391,740 B1 | 5/2002 | Cheung | |
| 6,500,694 B1 | 12/2002 | Enquist | |
| 6,563,133 B1 | 5/2003 | Tong | |
| 6,627,531 B2 | 9/2003 | Enquist | |
| 6,740,909 B2 | 5/2004 | Enquist | |
| 6,756,281 B2 | 6/2004 | Enquist | |
| 6,822,326 B2 | 11/2004 | Enquist et al. | |
| 6,864,585 B2 | 3/2005 | Enquist | |
| 6,867,073 B1 | 3/2005 | Enquist | |
| 6,875,671 B2 | 4/2005 | Faris | |
| 6,902,987 B1 | 6/2005 | Tong et al. | |
| 6,905,557 B2 | 6/2005 | Enquist | |
| 6,951,796 B2 * | 10/2005 | Sakaguchi | .................. 438/413 |
| 2005/0124138 A1 | 6/2005 | Aspar et al. | |

OTHER PUBLICATIONS

C. Gui, M. Elwenspoek, N. Tas, and J. G. E. Gardeniers; The Effect of Surface Roughness on Direct Wafer Bonding Journal of Applied Physics vol. 85, No. 10, May 15, 1999.

C. Gui, R. E. Oosterbroek, J. W. Berenschot, S. Schlautmann, T.S. J. Lammerink, A. Van Den Berg, M. C. Elwenspoek; Selective Wafer Bonding by Surface Roughness Control Journal of the Electrochemical Society, 148(4), G225-228, 2001.

(Continued)

*Primary Examiner*—Quoc Hoang
(74) *Attorney, Agent, or Firm*—Townsend, Townsend and Crew LLP (57) ABSTRACT

A method for fabricating one or more devices, e.g., integrated circuits. The method includes providing a substrate (e.g., silicon), which has a thickness of semiconductor material and a surface region. The substrate also has a cleave plane provided within the substrate to define the thickness of semiconductor material. The method includes joining the surface region of the substrate to a first handle substrate. In a preferred embodiment, the first handle substrate is termed a "thin" substrate, which provides suitable bonding characteristics, can withstand high temperature processing often desired during the manufacture of semiconductor devices, and has desirable de-bonding characteristics between it and a second handle substrate, which will be described in more detail below. In a preferred embodiment, the first handle substrate is also thick enough and rigid enough to allow for cleaving according to a specific embodiment.

35 Claims, 11 Drawing Sheets

OTHER PUBLICATIONS

Prof. Krishna Saraswat 3-Dimensional ICs: Motivation, Performance Analysis and Technology "3D Architectures for Semiconductor Integration and Packaging", Tempe AZ Jun. 13-15, 2005.

Piet De Moor Technology Development for 3D Integration at IMEC "3D Architectures for Semiconductor Integration and Packaging", Tempe AZ Jun. 13-15, 2005.

Jean-Pierre Joly, New Wafer to Wafer and Chip to Wafer Device Stacking Technology Implementations "3D Architectures for Semiconductor Integration and Packaging", Tempe AZ Jun. 13-15, 2005.

Jim Walker, 3D Packaging: Density, Design and Decisions "3D Architectures for Semiconductor Integration and Packaging", Tempe AZ Jun. 13-15, 2005.

Philip Garrou 3D Integration: A Status Report "3D Architectures for Semiconductor Integration and Packaging", Tempe AZ Jun. 13-15, 2005.

* cited by examiner

THIN HANDLE SUBSTRATE METHOD AND STRUCTURE FOR FABRICATING DEVICES USING ONE OR MORE FILMS PROVIDED BY A LAYER TRANSFER PROCESS

BACKGROUND OF THE INVENTION

The present invention relates to the manufacture of substrates. More particularly, the invention provides a technique including a method and a structure for forming multi-layered substrate structures for the fabrication of substrates for semiconductor integrated circuit devices using layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

From the very early days, human beings have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, a flat panel display, and others. These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and or brittle materials, such as diamond or glass. The saw operation also cannot be used effectively for the manufacture of microelectronic devices, including integrated circuit devices, and the like.

Accordingly, techniques have been developed to fabricate microelectronic devices, commonly called semiconductor integrated circuits. Such integrated circuits are often developed using a technique called the "planar process" developed in the early days of semiconductor manufacturing. An example of one of the early semiconductor techniques is described in U.S. Pat. No. 2,981,877, in the name of Robert Noyce, who has been recognized as one of the father's of the integrated circuit. Such integrated circuits have evolved from a handful of electronic elements into millions and even billions of components fabricated on a small slice of silicon material. Such integrated circuits have been incorporated into and control many of today's devices, such as computers, cellular phones, toys, automobiles, and all types of medical equipment.

Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Increasing circuit density has not only improved the complexity and performance of integrated circuits but has also provided lower cost parts to the consumer.

Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials. An example of such a process is an ability to make the thickness of the substrate thin after the manufacture of the integrated circuit devices thereon. A conventional process often used to thin these device layers is often called "back grinding," which is often cumbersome, prone to cause device failures, and can only thin the device layer to a certain thickness. Although there have been significant improvements, such back grinding processes still have many limitations.

Accordingly, certain techniques have been developed to cleave a thin film of crystalline material from a larger donor substrate portion. These techniques are commonly known as "layer transfer" processes. Such layer transfer processes have been useful in the manufacture of specialized substrate structures, such as silicon on insulator or display substrates. As merely an example, a pioneering technique was developed by Francois J. Henley and Nathan Chung to cleave films of materials. Such technique has been described in U.S. Pat. No. 6,013,563 titled Controlled Cleaving Process, assigned to Silicon Genesis Corporation of San Jose, Calif., and hereby incorporated by reference for all purposes. Although such technique has been successful, there is still a desire for improved ways of manufacturing multilayered structures.

From the above, it is seen that a technique for manufacturing large substrates which is cost effective and efficient is desirable.

BRIEF SUMMARY OF THE INVENTION

According to the present invention, techniques related to the manufacture of substrates are provided. More particularly, the invention provides a technique including a method and a structure for forming multi-layered substrate structures for the fabrication of substrates for semiconductor integrated circuit devices (e.g., active device (e.g., MOS transistor, CMOS transistor, bipolar), passive devices (e.g., resistors, capacitors, inductors)) using layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

In a specific embodiment, the present invention provides a method for fabricating one or more devices, e.g., integrated circuits. The method includes providing a substrate (e.g., silicon), which has a thickness of semiconductor material and a surface region. The substrate also has a cleave plane provided within the substrate to define the thickness of semiconductor material. The method includes joining the surface region of the substrate to a first handle substrate. In a preferred embodiment, the first handle substrate is termed a "thin" substrate, which provides suitable bonding characteristics, can withstand high temperature processing often desired during the manufacture of semiconductor devices, and has desirable de-bonding characteristics between it and a second handle substrate, which will be described in more detail below. In a preferred embodiment, the term thin can mean less than 300 microns for a silicon substrate. In a preferred embodiment, the first handle substrate is also thick enough and rigid enough to allow for cleaving according to a specific embodiment. In a specific embodiment, joining occurs using a glue process, an electro static process, a non-organic glue process, an anodic process, a plasma activation process, or a wet activation process, any combination of these, and other suitable techniques.

In a specific embodiment, the method also includes initiating a controlled cleaving action at a portion of the cleave plane to detach the thickness of semiconductor material from the substrate, while the thickness of semiconductor material remains joined to the first handle substrate, to expose a second surface region of the thickness of semiconductor material. The method includes joining a backside of the first handle substrate to a second handle substrate. In a preferred embodiment, the method includes processing the second handle substrate with the thickness of semiconductor material using one or more processes to form at least one integrated circuit device onto a portion of the thickness of semiconductor material. The method forms a planarized surface region overlying the thickness of semiconductor material and joins the planarized surface region to a face of a third handle substrate. The method includes removing the second handle substrate from the first handle substrate including the thickness of semiconductor material, while the face of the third handle substrate remains joined to the planarized surface region.

Numerous benefits are achieved over pre-existing techniques using the present invention. In particular, the present invention uses controlled energy and selected conditions to preferentially cleave a thin film of material without a possibility of damage to such film from excessive energy release. This cleaving process selectively removes the thin film of material from the substrate while preventing a possibility of damage to the film or a remaining portion of the substrate. Additionally, the present method and structures allow for more efficient processing using a cleave layer provided in a substrate through the course of semiconductor processing, which may occur at higher temperatures, according to a specific embodiment. Once the cleaved layer has been subjected to integrated circuit processing techniques, a handle substrate, which held the cleaved layer is selectively removed. In a preferred embodiment, the present invention provides a "thin" handle substrate, which can remain and be used for device processing, including manufacture of interconnections, other devices, any combination of these, and the like. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

According to the present invention, techniques related to the manufacture of substrates are provided. More particularly, the invention provides a technique including a method and a structure for forming multi-layered substrate structures for the fabrication of substrates for semiconductor integrated circuit devices using layer transfer techniques. But it will be recognized that the invention has a wider range of applicability; it can also be applied to other types of substrates for three-dimensional packaging (e.g., wafer scale) of integrated semiconductor devices, photonic devices, piezoelectronic devices, flat panel displays, microelectromechanical systems ("MEMS"), nano-technology structures, sensors, actuators, solar cells, biological and biomedical devices, and the like.

Figure 1:
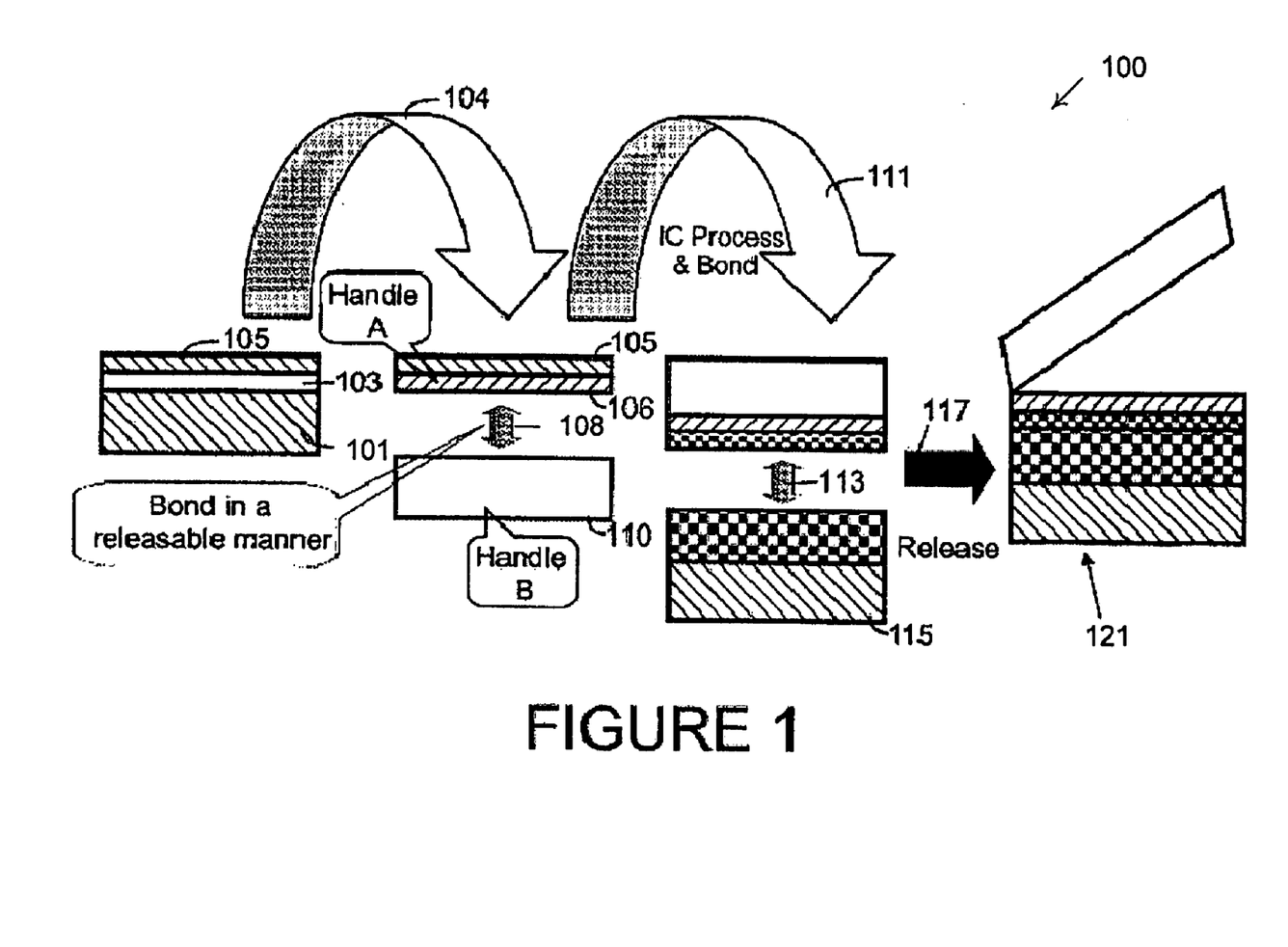
FIG. 1 illustrates an overall simplified method for manufacturing integrated circuits on a layer transferred substrate using a thin handle substrate according to embodiments of the present invention.

Referring to FIG. 1, a method 100 for fabricating integrated circuits on a layer transferred substrate according to embodiments of the present invention may be outlined as follows:

1 Provide a semiconductor substrate 101, e.g., silicon, germanium, a silicon-germanium alloy, gallium arsenide, any Group III/V materials, and others;

2. Form a cleave plane 103 (including a plurality of particles, deposited material, or any combination of these, and the like) to define a thickness of semiconductor material 105 (which is from a donor substrate) provided within the semiconductor substrate;

3. Join (step 104) the surface region of the substrate to a first handle substrate 106, which is the thin handle substrate;

4. Initiate a controlled cleaving action at a portion of the cleave plane to detach the thickness of semiconductor material 105 from the substrate, while the thickness of semiconductor material remains joined to the first handle substrate 106;

5. Join (step 108) a backside of the first handle substrate to a second handle substrate 110, e.g., conductive material (e.g., aluminum), semiconductor (e.g., silicon, polysilicon, amorphous silicon), dielectric material (e.g., glass, quartz), polymer (e.g., plastic);

6. Process (step 111) the first handle substrate with the thickness of semiconductor material and attached second handle substrate using one or more processes to form at least one integrated circuit device onto a portion of the thickness of semiconductor material, while the thickness of semiconductor material remains joined to the first handle substrate, which remains joined to the second handle substrate;

7. Form a planarized surface region overlying the thickness of semiconductor material;

8. Join (step 113) the planarized surface region of the thickness of material on the first substrate to a face of a third handle substrate 115, which may include a bulk substrate material or be multi-layered, e.g., conductive material (e.g., aluminum), semiconductor (e.g., silicon, polysilicon, amorphous silicon), dielectric material (e.g., glass, quartz), polymer (e.g., plastic);

9. Selectively remove the second handle substrate from the first handle substrate (step 117), while the face of the third handle substrate remains joined to the planarized surface region and while the first handle substrate remains joined to the thickness of semiconductor material;

10. Form a resulting third handle substrate 121 and first handle substrate including the sandwiched thickness of material with at least one integrated circuit device thereon;

11. Optionally, the above steps can be repeated again for at least one or more other layers, which includes other integrated circuit device elements or other features; and 12. Perform other steps, as desired.

The above sequence of steps provides a method according to an embodiment of the present invention. As shown, the method uses a combination of steps including a way of forming multiple handle substrates including a thickness of material, which is subjected to processing. At least one of the handle substrates is a thin substrate that preferably remains on the thickness of material throughout the processing. The other handle substrate is selectively removed and/or cleaved after processing while the thickness of material large substrate (including the first thin substrate) is transferred to another substrate structure according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 11 illustrate a simplified method for manufacturing integrated circuits on a layer transferred substrate according to embodiments of the present invention. These diagrams are merely illustrations that should not unduly limit the scope of the claims herein. One of ordinary skill in the art would recognize other variations, modifications, and alternatives. As shown, the method includes providing a semiconductor substrate 200, e.g., silicon, germanium, a silicon-germanium alloy, gallium arsenide, any Group III/V materials, and others. In a specific embodiment, the semiconductor substrate can be made of a single homogenous material, or a combination of various layers, depending upon the specific embodiment. For example, a dielectric layer such as a silicon oxide layer can be present on the surface 207 in a specific embodiment. Of course, there can be other variations, modifications, and alternatives.

Figure 2:
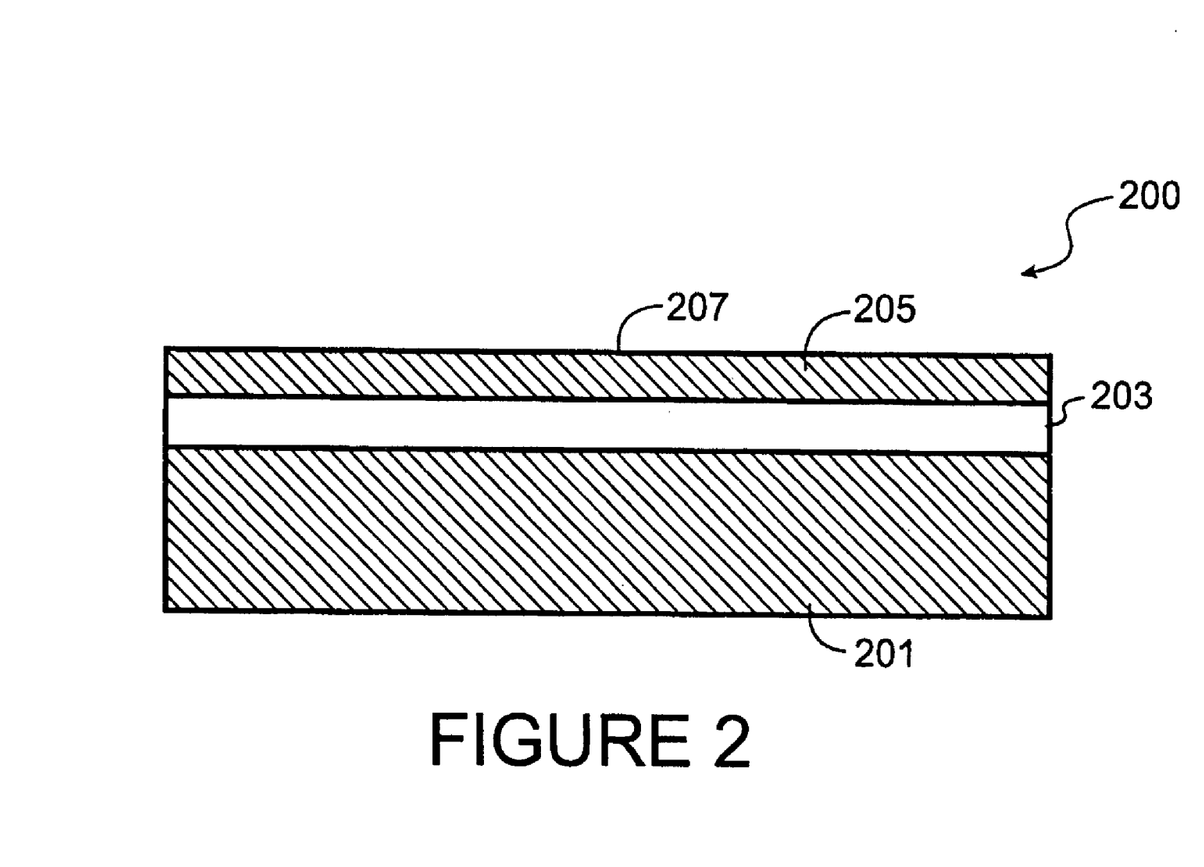
FIGS. 2 through 11 illustrate a simplified method for manufacturing integrated circuits on a layer transferred substrate using a thin handle substrate according to embodiments of the present invention.

In a preferred embodiment, the substrate 201 has a thickness of semiconductor material 205 and a surface region 207. In a specific embodiment, the substrate also has a cleave plane 203 (including a plurality of particles, deposited material, or any combination of these, and the like) provided within the substrate, which defines the thickness of semiconductor material. Of course, there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Depending upon the embodiment, there may be other techniques for forming a cleave region and/or cleave layer. As merely an example, such cleave region is formed using other processes, such as those using a silicon-germanium cleave plane developed by Silicon Genesis Corporation of Santa Clara, Calif. and processes such as the SmartCut™ process of Soitec SA of France, and the Eltran™ process of Canon Inc. of Tokyo, Japan, any like processes, and others. Of course, there may be other variations, modifications, and alternatives.

Figure 3:
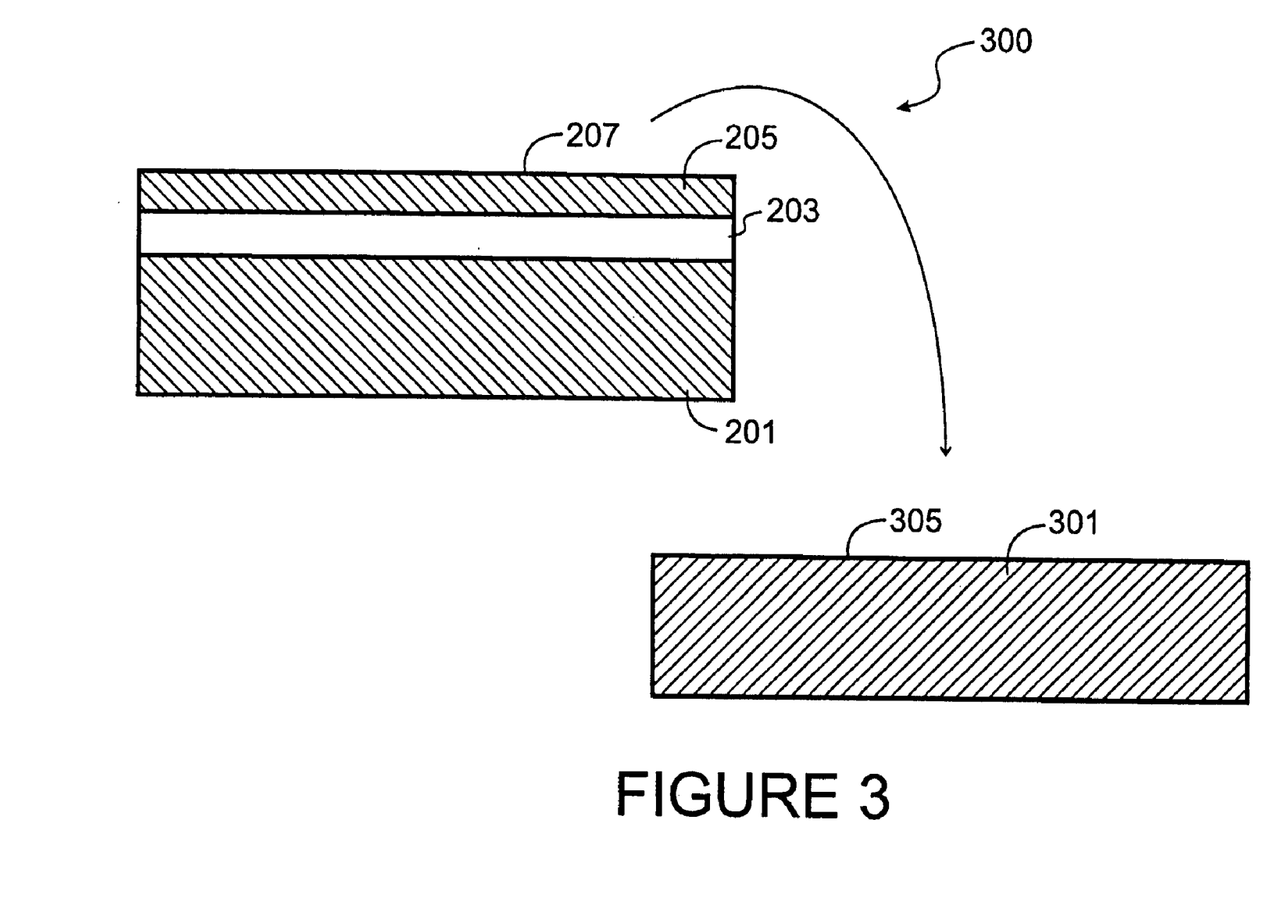

Referring now to FIG. 3, the method includes joining 300 the surface region of the semiconductor substrate to a first handle substrate 301. In a specific embodiment, the handle substrate is made of a suitable material that remains fixed to the thickness of material, but can also be selectively and/or easily removed from a second substrate, which will be described in more detail below. That is, the handle substrate can be made of a thin layer of silicon or the same type of material as the thickness of semiconductor material, which is layer transferred. The thin layer can be a single homogeneous material, multiple materials, or any combination of these. The first handle substrate is a silicon substrate according to a specific embodiment. In this embodiment, the first handle substrate can be attached to the thickness of material using an oxide interface layer which can act as an etch stop in the eventual thinning or removal of the first handle substrate. In a specific embodiment, the first handle substrate is a silicon substrate having a thickness of 300 microns and less. Additionally, the first handle substrate can be selectively removed from the second handle substrate although the second handle substrate firmly engages with the first handle substrate to withstand a temperature of about 1000 degrees centigrade and greater according to a specific embodiment. In a preferred embodiment, the semiconductor substrate and the first handle substrate are joined with a bond strength ranging from about 500 to over 2,000 milli-Joules per square meter. The specific bond energy is chosen such that the resulting bond strength is sufficiently high to allow for the controlled cleaving action to cleave the thickness of semiconductor material 105 onto the first handle substrate 301. Of course, there can be other handle substrate material such as ceramic or polysilicon substrates depending upon the specific embodiment. Certain desired considerations for suitability of a material as the first or second handle is the difference in thermal expansion coefficient, cost, and availability according to a specific embodiment.

In a preferred embodiment, the first handle substrate has a surface region 305, which will be joined and/or bonded with surface region 207 provided on substrate 201. Like reference numerals are used in this figure has others, but are not intended to be limiting the scope of the claims herein. Further details of the joining process can be found throughout the present specification and more particularly below.

Before joining, the surface regions of the material from the semiconductor substrate and the first handle substrate surfaces are each subjected to a cleaning solution to treat the surfaces of the substrates to clean the substrate surface regions according to a specific embodiment. An example of a solution used to clean the substrate and handle surfaces is a mixture of hydrogen peroxide and sulfuric acid, and other like solutions. A dryer dries the semiconductor substrate and handle surfaces to remove any residual liquids and/or particles from the substrate surfaces. Self-bonding occurs by placing surfaces of cleaned substrates (e.g., semiconductor substrate surface and handle substrate surface) together after an optional plasma activation process depending on the specific layer-transfer process used. If desired, such plasma activated processes clean and/or activate the surfaces of the substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together according to a specific embodiment. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the handle substrates is substantially permanent and has good reliability through an entirety of the semiconductor processing steps.

Accordingly after bonding, the bonded substrate structures are subjected to a bake treatment according to a specific embodiment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for a silicon donor substrate and the first handle substrate to attach themselves to each other permanently according to the preferred embodiment. Depending upon the specific application, there can be other variations, modifications, and alternatives. Depending upon the embodiment, the bake process may be optional.

In a specific embodiment, the substrates are joined or fused together using a low temperature thermal step. In a specific embodiment, the low temperature bonding process occurs by a self-bonding process. Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor substrate surface regions to the handle substrate. For instance, an electrostatic bonding technique can be used to join the two substrates together. In particular, one or both substrate surface(s) is charged to attract to the other substrate surface. Additionally, the donor substrate surface can be fused to the handle wafer using a variety of other commonly known techniques. Of course, the technique used depends upon the application.

Figure 4:
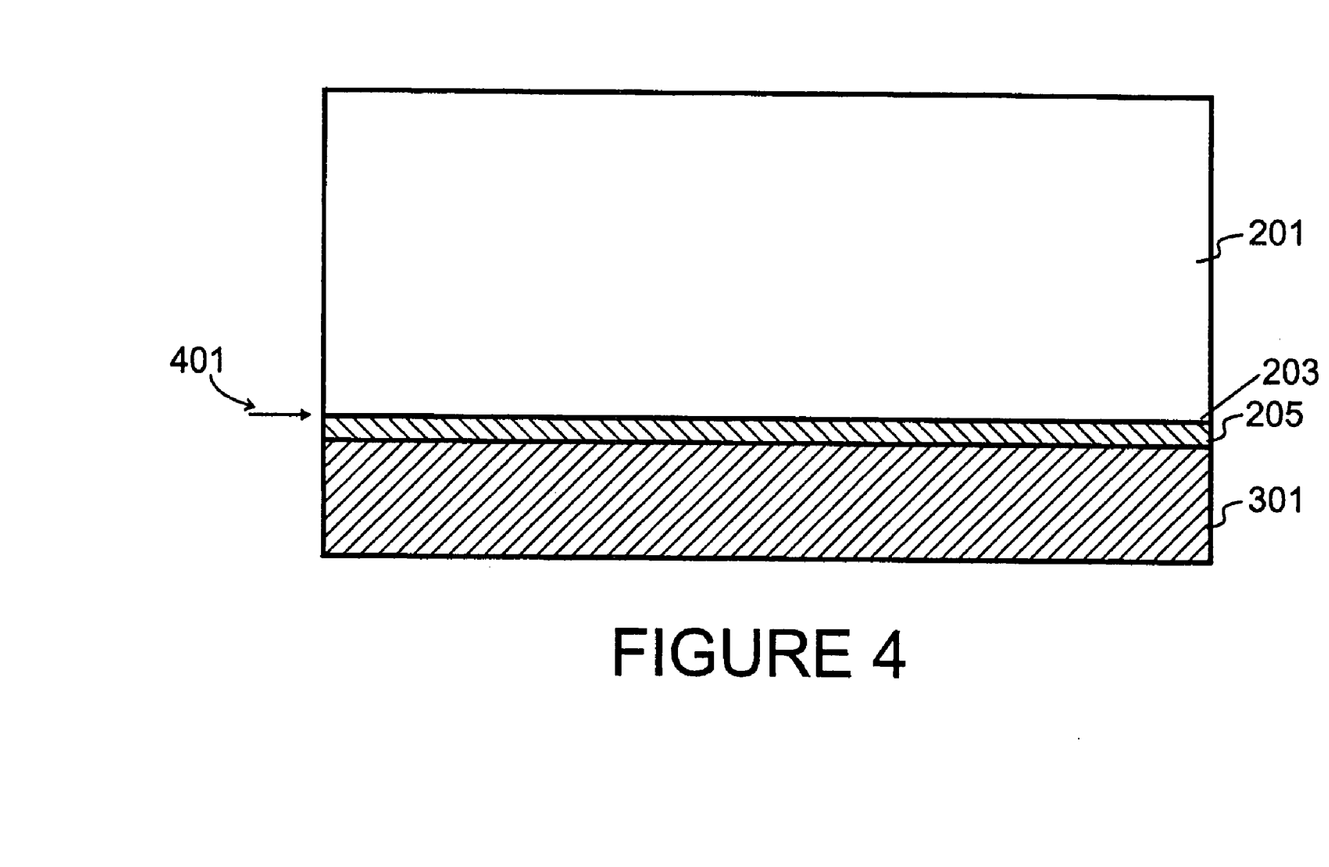

Referring to FIG. 4, the method includes initiating a controlled cleaving action using energy 401 provided at a selected portion of the cleave plane to detach the thickness of semiconductor material from the substrate, while the thickness of semiconductor material remains joined to the first handle substrate. Depending upon the specific embodiment, there can be certain variations. For example, the cleaving process can be a controlled cleaving process using a propagating cleave front to selectively free the thickness of material from the donor substrate attached to the handle substrate. Alternative techniques for cleaving can also be used. Such techniques, include, but are not limited to those called a Nanocleave™ process of Silicon Genesis Corporation of Santa Clara, Calif., a SmartCut™ process of Soitec SA of France, and an Eltran™ process of Canon Inc. of Tokyo, Japan, any like processes, and others. The method then removes the remaining portion of the semiconductor donor substrate, which provided the thickness of material to the handle substrate according to a specific embodiment.

In a specific embodiment, the thin substrate may be subjected to a backing plate and/or an electrostatic chuck to hold the thin substrate in place during the cleaving process. That is, the backing plate, which may be a silicon substrate, maintains the thickness of material in place with suitable rigidity, stiffness, and thickness to facilitate the cleaving of the thin film of material onto the first substrate. Depending upon the specific embodiment, an electrostatic, vacuum, and/or mechanical chuck may also be used to hold the first substrate in place during the cleaving of the thickness of material from the donor substrate. Also depending upon the specific embodiment, the backing plate (e.g., silicon substrate, plastic substrate, glass substrate) and/or chuck may be used to hold any of the substrates described herein during any one or more of the processes in place during such processes according to a specific embodiment. The backing plate and/or chuck allows for an efficient processing without de-lamination, breakage, and/or other processing imperfections according to a specific embodiment. Of course, there can be other variations, modifications, and alternatives.

Figure 5:
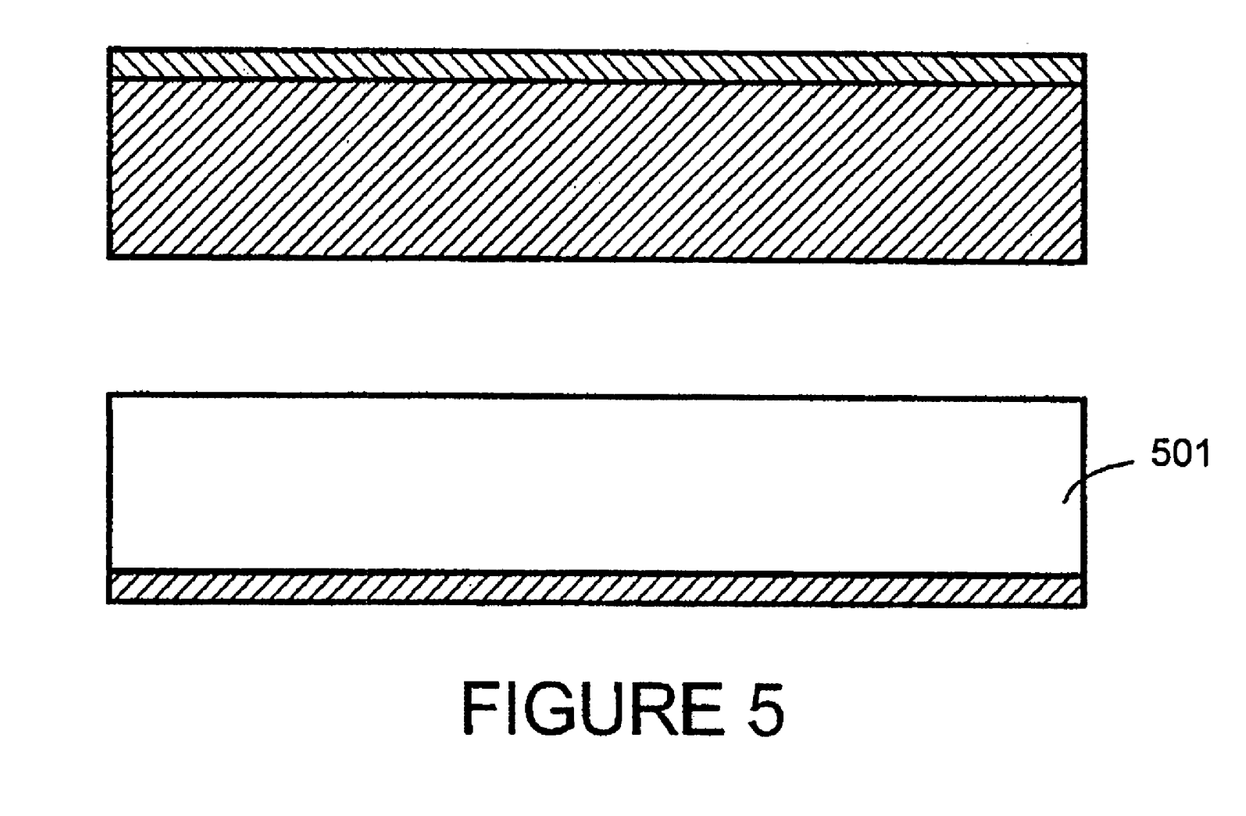

Referring to FIG. 5, the method joins a backside of the first handle substrate to a second handle substrate 501. In a specific embodiment, the backside is an entirety of the backside of the first handle substrate. The second handle substrate is made of a suitable material that can withstand high temperature processing while maintaining desired attachment to the first handle substrate according to a specific embodiment. The second handle substrate can also be selectively removed or desirably removed from the first handle substrate, including the thickness of material, after the high temperature process (e.g., 400 degrees Celsius and greater) according to a preferred embodiment. As merely an example, the second handle substrate can be made of a silicon, ceramic, quartz or polysilicon, which can be removed from the first thin handle substrate made of single crystal silicon material according to a specific embodiment. Either or both surfaces here can also be oxidized but in a preferred embodiment would be roughened in a controlled manner to allow selective bond strength to be applied.

Figure 6:
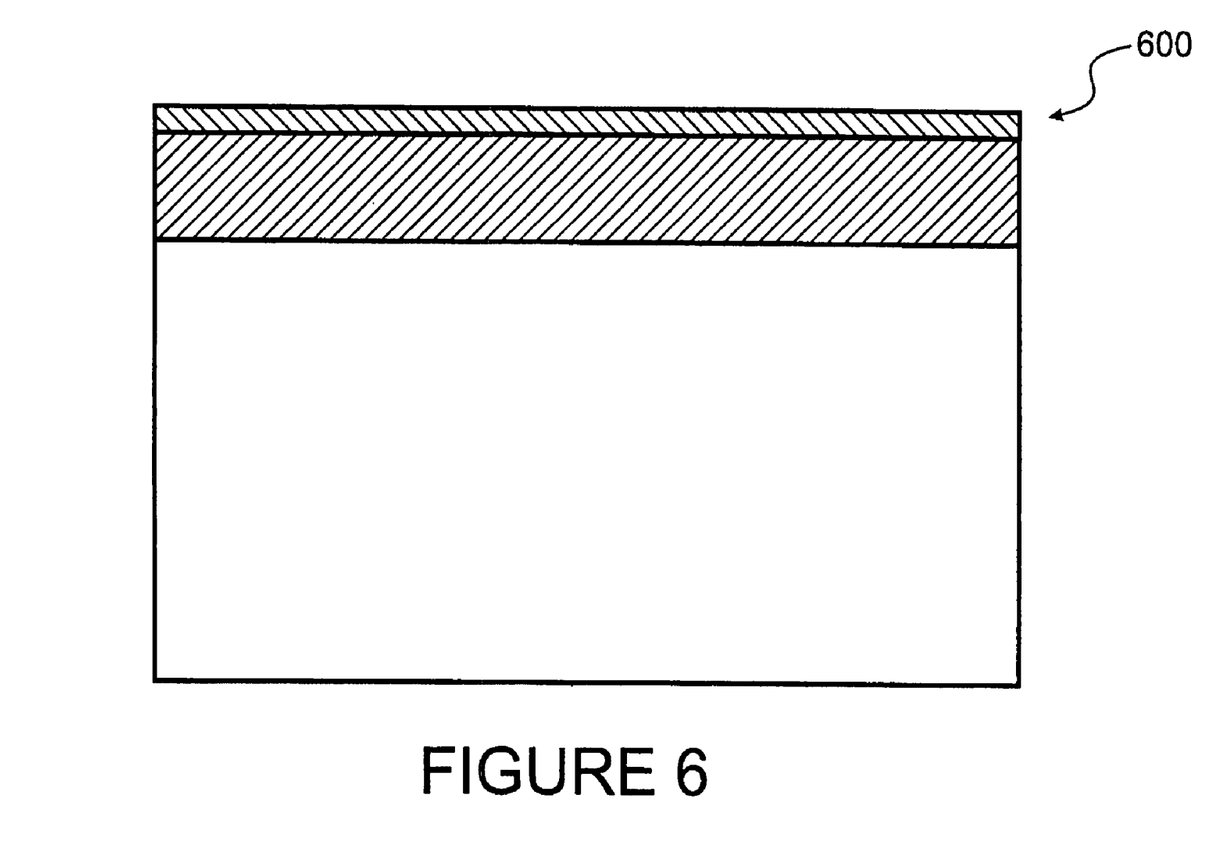

Referring to FIG. 6, the method provides a resulting second handle substrate 600 attached to the first handle substrate and overlying thickness of semiconductor material according to a specific embodiment. In a preferred embodiment, the first substrate, second substrate, and thickness of material are characterized by a total thickness ranging at about 725 microns and a diameter of about 200 millimeters. In a preferred embodiment, the first handle substrate and the second handle substrate are joined with a bond strength ranging from about 100–500 milli-Joules per square meter. The specific bond energy is selected such that the resulting bond strength is sufficiently high (i.e., prevent delamination between the substrates) to allow for device processing while low enough to allow for separation using a cleaving action after device processing, which often includes a variety of processing steps and conditions according to a specific embodiment. A method to engineer a suitably low bond energy is to tune the plasma processing parameters and the pre-bond surface roughness to accomplish the desired surface bond energy after the device process thermal cycles according to a specific embodiment. Of course, there can be other handle substrate material such as ceramic or polysilicon substrates depending upon the specific embodiment. Certain desired considerations for suitability of a material of the first or second handle substrate include the difference in thermal expansion coefficient, cost, and availability, among other factors according to a specific embodiment. Of course, there can be other modifications, variations, and alternatives.

In a specific embodiment, the resulting handle substrates and thickness of material have suitable characteristics for undergoing one or more processing steps. That is, the handle substrates can be subjected to conventional semiconductor processing techniques, including but not limited to, photolithography, etching, implanting, thermal annealing, chemical mechanical polishing, diffusion, deposition, and other others, which may be known by one of ordinary skill in the art. The second handle substrate can also be selectively removed while transferring the thin film of material onto another substrate structure according to a specific embodiment.

Figure 7:
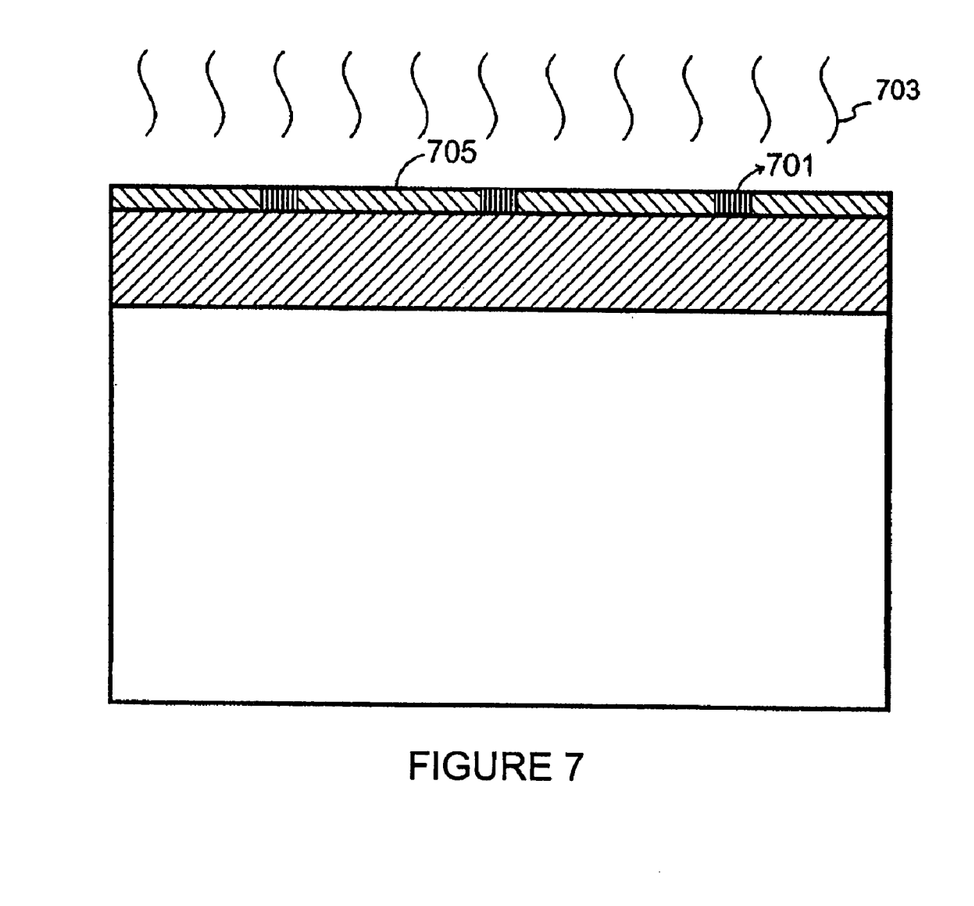

Referring to FIG. 7, the present method performs other processes on portions of the thickness of semiconductor material, which has been attached to the first handle substrate. The method forms one or more devices 701 on one or more portions of the thin film of material overlying the handle substrate surface. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel display devices (e.g., LCD, AMLCD), biological and biomedical devices, and the like. Such devices can be made using deposition, etching, implantation, photo masking processes, any combination of these, and the like. Of course, there can be other variations, modifications, and alternatives. Additionally, other steps can also be formed, as desired.

In a preferred embodiment, the processing includes high temperature semiconductor processing techniques 703 to form conventional integrated circuits thereon. The method forms a planarized surface region 705 overlying the thickness of semiconductor material. In a specific embodiment, the planarized surface region can be formed using one or more suitable techniques. Such techniques include deposition of a dielectric layer, which is later reflowed using thermal treatment. The planarized surface region can also be formed using a chemical mechanical polishing process including a suitable slurry, pad, and process according to a specific embodiment. The planarized surface region can also be formed using any combination of these techniques and others (e.g., etch back, conformal deposition) according to a specific embodiment. The planarized surface region preferably has a uniformity of about 0.1% to about 5% end to end, and is within about 15 Angstroms RMS in roughness as measured on a 2 micron by 2 micron atomic-force microscope scan. Of course, there can be other variations, modifications, and alternatives.

Figure 8:
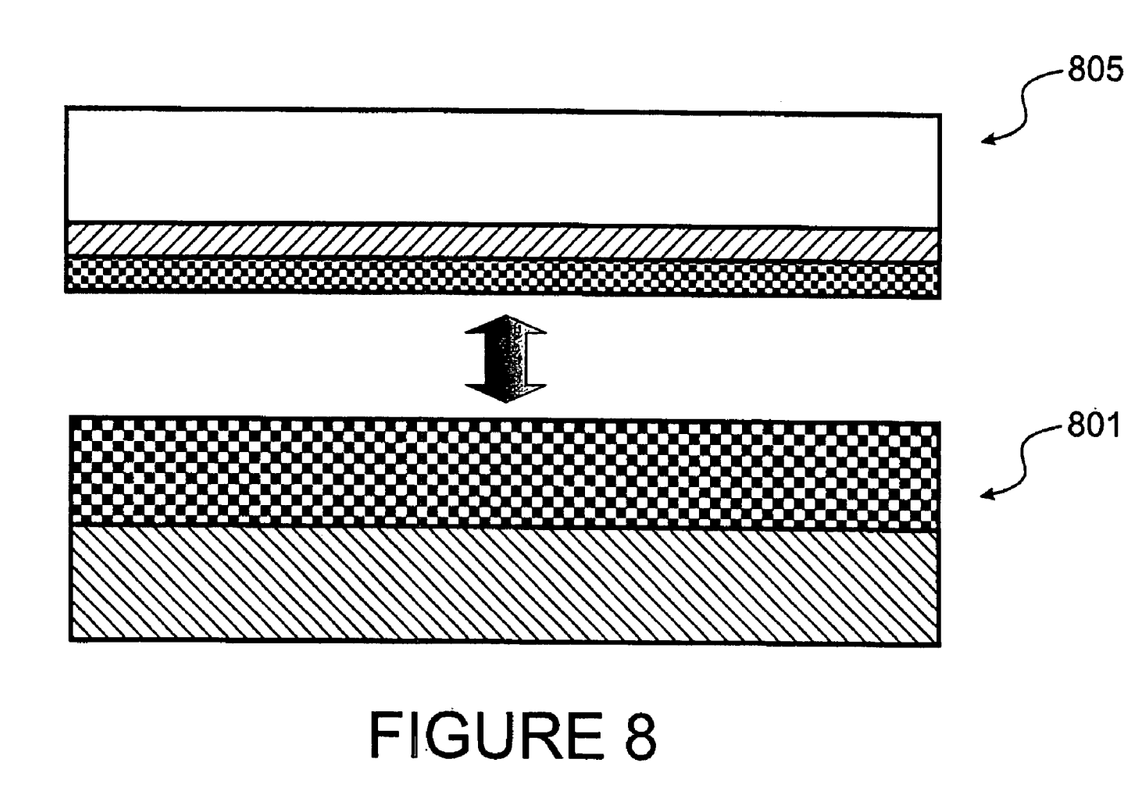

In a specific embodiment, the method also joins the planarized surface region of the resulting processed handle substrate 805 to a face of a third handle substrate 801, as illustrated by FIG. 8. Before joining, the planarized surface region overlying the thickness of material and the third handle substrate surfaces are each subjected to a cleaning solution to treat the surfaces of the substrates to clean the substrate surface regions according to a specific embodiment. An example of a solution used to clean the substrate and handle surfaces is a mixture of hydrogen peroxide and sulfuric acid, and other like solutions. A dryer dries the semiconductor substrate and the third handle surfaces to remove any residual liquids and/or particles from the substrate surfaces. Self-bonding occurs by placing surfaces of cleaned substrates (e.g., planarized region and third handle substrate surface) together after an optional plasma activation process depending on the specific layer-transfer process used. If desired, such plasma activated processes clean and/or activate the surfaces of the processed substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates (and processed devices) is bonded together according to a specific embodiment. As shown, the third handle substrate has been bonded to the planarized surface region. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the third handle substrate and the planarized surface is substantially permanent and has good reliability.

Accordingly after bonding, the bonded substrate structures are subjected to a bake treatment according to a specific embodiment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for a planarized substrate region and the third handle substrate to attach themselves to each other permanently according to the preferred embodiment. Depending upon the specific application, there can be other variations, modifications, and alternatives.

In a specific embodiment, the substrates are joined or fused together using a low temperature thermal step. In a specific embodiment, the low temperature bonding process occurs by a self-bonding process. Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the substrate surface region to the handle substrate. For instance, an electro-static bonding technique can be used to join the two substrates together. In particular, one or both substrate surface(s) is charged to attract to the other substrate surface. Additionally, the donor substrate surface can be fused to the handle wafer using a variety of other commonly known techniques. Of course, the technique used depends upon the application.

Figure 9:
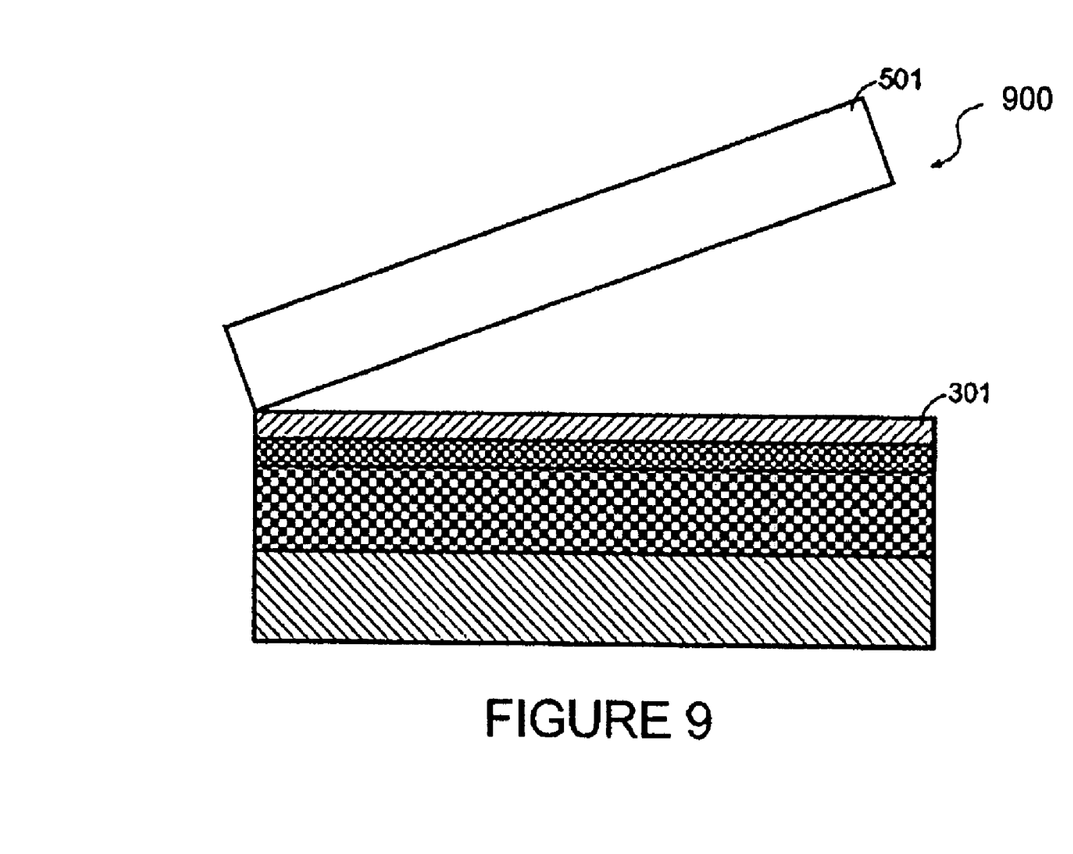

In a specific embodiment, the method selectively removes 900 the second handle substrate from the first handle substrate, while the face of the third handle substrate remains joined the thickness of material, which remains joined to the first handle substrate, as illustrated by FIG. 9. In a specific embodiment, the method uses a selective etching solution to selectively remove the second handle substrate from the first handle substrate. In a preferred embodiment, the solution is hydrofluoric acid if the second substrate is quartz. Alternatively, the preferred method would be to utilize a cleaving action to remove the second handle substrate from the first handle substrate according to a specific embodiment. This would be made possible by the engineering of the first to second handle wafer bond energy to be made low enough while the surface energy of the third handle surface to the thickness of material was made substantially higher. In this fashion, the cleaving could be successfully initiated and propagated through the first and second handle interface. Of course, there can be other variations, modifications and alternatives.

In a specific embodiment, once the first and second handle substrates are separated, planarizing and other processing are provided on the thickness of semiconductor material, first handle substrate and third handle substrate assembly to contact devices through via holes formation and metallization. Via hole and contact formation would generally be easier to achieve if the first handle thickness is of a limited thickness, which facilitates conventional etching and deposition techniques. Certain advantages of this process therefore becomes achieved when a thin first handle (5–50 um for example) is utilized and via contact formation has a contact hole width to height ratio that allows high density and reliable 3-dimensional contacts to be formed. Depending upon the specific embodiment, one or more via structures can be formed on the first handle substrate. The via structures can have an width (e.g., 1 micron, 0.5 micron, 0.35 micron, 0.25 micron, 0.18 micron, 0.13 micron, 0.11 micron, 95 nanometers and less) to depth ratio ranging from about 1/5 to about 1/30 according to a specific embodiment. Of course, there can be other variations, modifications, and alternatives.

Figure 10:
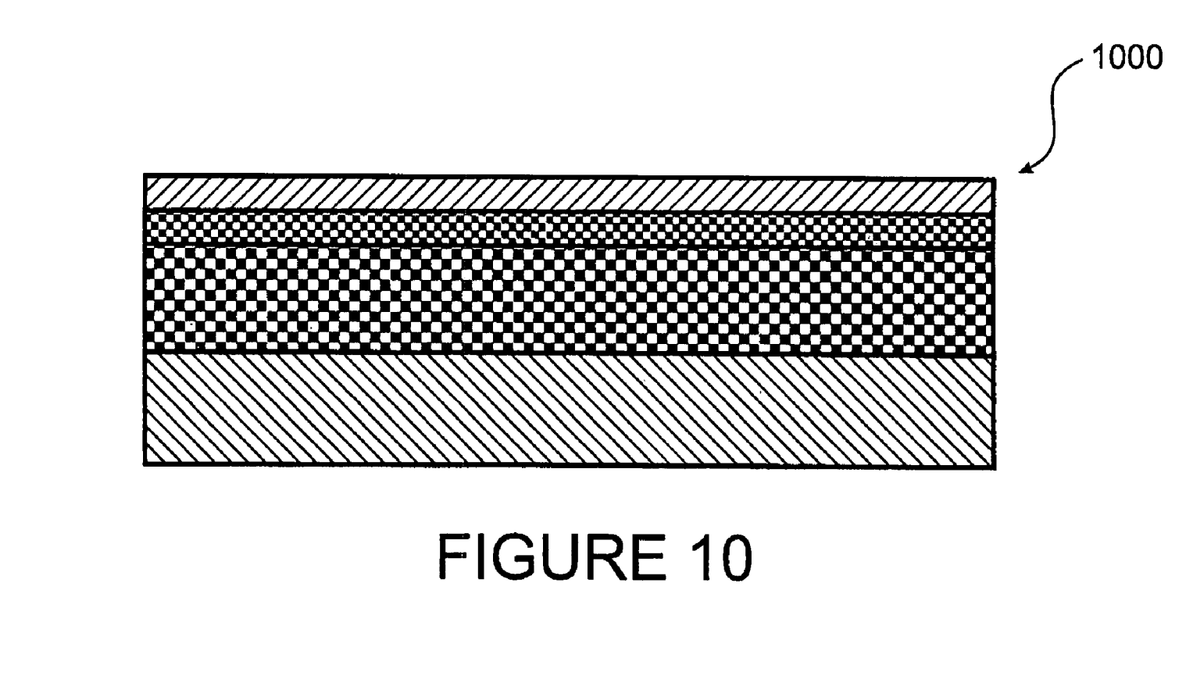

Optionally, the method can use a combination of techniques to remove the first handle substrate from the second handle substrate to form a resulting substrate 1000, as illustrated by FIG. 9. In a specific embodiment, the method can apply a grinding process, such as "back grind" to remove a certain thickness of material from the second handle substrate and/or cleaved off. After such material has been removed, the method can selectively remove any remaining material using a selective etching process, which may be a dry and/or wet etching process according to a specific embodiment. Alternatively, the method can use a chemical mechanical polishing process to remove a certain thickness of the second handle substrate according to a specific embodiment. That is, chemical mechanical polishing can be used in combination with any of the techniques described herein, as well as other, and can be used alone according to a specific embodiment. Alternatively, any of these techniques may also be combined with cleaving techniques according to a specific embodiment. Additionally, it is preferred in certain embodiments to be free from any grinding, polishing, and/or etch back techniques according to a specific embodiment.

Figure 11:
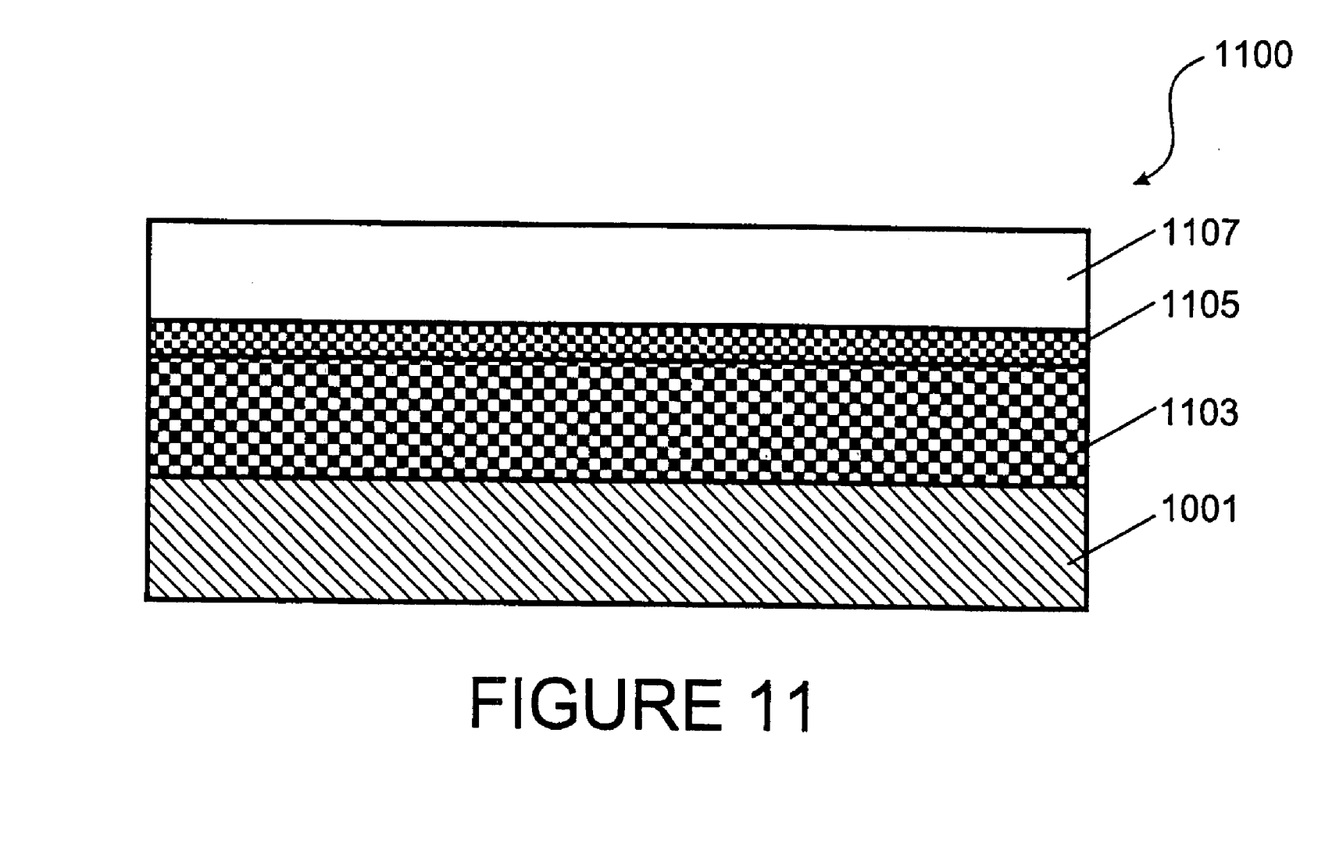

Additionally processes may include repeating the layer transfer processes to form resulting multi-layered substrate structure 1100 according to a specific embodiment, as illustrated by FIG. 11. The structure 1100 includes bulk substrate 1001. The bulk substrate includes an overlying layer 1103, which may be a layer transferred layer or other layer, such as strained silicon and/or the like. The overlying layer 1103 includes layer transferred layer 1105 (e.g., strained material, strained silicon, relaxed material, <111> single crystal silicon, <100> single crystal silicon, <110> single crystal silicon), which has processed and completed device structures thereon. Overlying layer 1105 includes one or more layers 1107, which also may be layer transferred, deposited, or any combination of these, according to a specific embodiment. Of course, there can be other variations, modifications, and alternatives.

While the above is a full description of the specific embodiments, various modifications, alternative constructions and equivalents may be used. Other multi-layered substrate techniques, which may be combined with any elements of the present application, can be found in co-pending application U.S. application Ser. No. 11/200,413 filed on the same date of this patent application, commonly assigned, and hereby incorporated by reference for all purposes. Therefore, the above description and illustrations should not be taken as limiting the scope of the present invention which is defined by the appended claims.

What is claimed is:

1. A method for fabricating one or more devices, the method comprising:
providing a substrate, the substrate having a thickness of semiconductor material and a surface region, the substrate also having a cleave plane provided within the substrate and defining the thickness of semiconductor material;
joining the surface region of the substrate to a first handle substrate;
initiating and propagating a controlled cleaving action at a portion of the cleave plane to detach the thickness of semiconductor material from the substrate, while the thickness of semiconductor material remains joined to the first handle substrate, to expose a second surface region of the thickness of semiconductor material;
joining a backside of the first handle substrate to a second handle substrate;
processing the second handle substrate with the thickness of semiconductor material using one or more processes to form at least one integrated circuit device onto a portion of the thickness of semiconductor material;
forming a planarized surface region overlying the thickness of semiconductor material;
joining the planarized surface region to a face of a third handle substrate; and
removing the second handle substrate from the first handle substrate including the thickness of semiconductor material, while the face of the third handle substrate remains joined to the planarized surface region.

2. The method of claim 1 wherein the first handle substrate is a silicon substrate.

3. The method of claim 1 wherein the first handle substrate is a silicon substrate having a thickness of 300 microns and less.

4. The method of claim 1 wherein the first handle substrate can be selectively removed from the second handle substrate.

5. The method of claim 1 wherein the second handle substrate firmly engages with the first handle substrate to withstand a temperature of about 400 degrees Celsius and greater.

6. The method of claim 1 wherein the joining of the between the first handle substrate and the second handle substrate has a bond strength ranging from about 100–500 millijoules per square meter.

7. The method of claim 1 wherein the first handle substrate is detachable from the second handle substrate after processing the second handle substrate to form the integrated circuit device.

8. The method of claim 1 further comprising patterning the first handle substrate coupled to the third handle substrate to form one or more via structures, the one or more via structures having a width to depth ratio ranging from about 1/5 to about 1/30.

9. The method of claim 1 wherein the first substrate, second substrate, and thickness of material are characterized by a total thickness ranging at about 725 microns and a diameter of about 200 millimeters.

10. The method of claim 1 wherein the substrate is a silicon on insulator wafer.

11. The method of claim 1 wherein the substrate is a silicon wafer.

12. The method of claim 1 wherein the substrate comprises a silicon bearing material.

13. The method of claim 1 wherein the thickness of semiconductor material is single crystal silicon material.

14. The method of claim 1 wherein the thickness of semiconductor material comprises a silicon bearing material characterized by a strained portion within a region of the silicon bearing material.

15. The method of claim 1 wherein the substrate comprises a multilayered structure, the multilayered structure having an overlying insulating material and/or an amorphous silicon material.

16. The method of claim 1 wherein the cleave plane comprises a plurality of particles.

17. The method of claim 1 wherein the cleave plane comprises a plurality of hydrogen bearing particles.

18. The method of claim 1 wherein the cleave plane comprises a strained region.

19. The method of claim 1 wherein the cleave plane comprises a deposited material.

20. The method of claim 1 wherein the cleave plane comprises a weakened region.

21. The method of claim 1 wherein the controlled cleaving action forms a single propagating cleave front on the portion of the cleave plane.

22. The method of claim 1 wherein the controlled cleaving action forms more than one propagating cleave fronts on the portion of the cleave plane.

23. The method of claim 1 wherein the joining of the surface region of the substrate to the first handle substrate is provided by a bonding process.

24. The method of claim 1 wherein the joining comprises a plasma activation bonding process.

25. The method of claim 1 wherein the joining comprises a bonding process selected from a glue process, an electro static process, a non-organic glue process, an anodic process, a plasma activation process, or a wet activation process.

26. The method of claim 1 wherein the first handle substrate has a thickness ranging from about 5 microns to about 10 microns.

27. The method of claim 1 wherein the second handle substrate is selected from a silicon substrate, a polysilicon substrate and a quartz substrate.

28. The method of claim 1 wherein the one integrated circuit device comprises a MOSFET.

29. The method of claim 1 wherein the one integrated circuit device comprises a CMOS device.

30. The method of claim 1 wherein the one integrated circuit device is selected from an active device, a capacitor, a resistor and an inductor.

31. The method of claim 1 wherein the third handle substrate is selected from a semiconductor substrate, a silicon substrate, and a multi-layer stack of integrated devices.

32. The method of claim 1 wherein the planarized surface region comprises an oxide bearing material.

33. The method of claim 1 wherein the planarized surface region is selected from oxide, nitride, spin-on-glass, and metal.

34. The method of claim 1 wherein the removing comprises using a mechanical separation process to remove the second handle substrate from the first handle substrate.

35. The method of claim 1 wherein the first handle substrate is selected from a silicon substrate, a polysilicon substrate and a quartz substrate.

* * * * *